US008836129B1

(12) United States Patent
Hung et al.

(10) Patent No.: US 8,836,129 B1
(45) Date of Patent: Sep. 16, 2014

(54) PLUG STRUCTURE (71) Applicant: United Microelectronics Corp., Hsin-Chu (TW)

(72) Inventors: Ching-Wen Hung, Tainan (TW); Chih-Sen Huang, Tainan (TW); Po-Chao Tsao, New Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/802,917

(22) Filed: Mar. 14, 2013

(51) Int. Cl.
*H01L 23/48* (2006.01)
*H01L 23/52* (2006.01)
*H01L 29/40* (2006.01)
*H01L 21/768* (2006.01)
*H01L 23/538* (2006.01)

(52) U.S. Cl.
CPC ...... *H01L 21/76841* (2013.01); *H01L 23/5384* (2013.01)
USPC ............ 257/760; 257/E21.214; 257/E21.304; 257/E21.483; 257/E21.577; 257/E21.583; 257/758; 257/761; 438/672; 438/618; 438/622; 438/637; 438/640

(58) Field of Classification Search
CPC .......... H01L 21/00; H01L 28/00; H01L 27/00
USPC ................... 257/E21.018, E21.021, E27.016, 257/E27.048
See application file for complete search history.

(56) References Cited

U.S. PATENT DOCUMENTS

| | | | |
|---|---|---|---|
| 5,563,096 A | 10/1996 | Nasr | |
| 5,847,421 A | 12/1998 | Yamaguchi | |
| 5,950,090 A | 9/1999 | Chen | |
| 6,171,436 B1 | 1/2001 | Huynh | |
| 6,372,605 B1 | 4/2002 | Kuehne | |
| 6,380,065 B1 | 4/2002 | Komai | |
| 6,498,091 B1 * | 12/2002 | Chen et al. | 438/627 |
| 6,664,190 B2 | 12/2003 | Chen | |
| 7,166,506 B2 | 1/2007 | Prince | |
| 7,195,535 B1 | 3/2007 | Swedek | |
| 7,196,010 B2 | 3/2007 | Park | |
| 7,399,437 B2 | 7/2008 | James | |
| 7,687,393 B2 | 3/2010 | Iwasa | |
| 7,781,864 B2 * | 8/2010 | Kang | 257/532 |
| 2003/0087520 A1 * | 5/2003 | Chen et al. | 438/643 |
| 2003/0166338 A1 | 9/2003 | Ahn | |
| 2009/0170309 A1 * | 7/2009 | Chikarmane et al. | 438/643 |

(Continued)

OTHER PUBLICATIONS

Hung, Title of Invention: Method of Forming Semiconductor Structure Having Contact Plug, pending U.S. Appl. No. 13/740,289, filed Jan. 14, 2013.

*Primary Examiner* — Telly Green (74) *Attorney, Agent, or Firm* — Winston Hsu; Scott Margo (57) ABSTRACT

A plug structure including a first dielectric layer, a second dielectric layer, a barrier layer and a second plug is provided. The first dielectric layer having a first plug therein is located on a substrate, wherein the first plug physically contacts a source/drain in the substrate. The second dielectric layer having an opening exposing the first plug is located on the first dielectric layer. The barrier layer conformally covers the opening, wherein the barrier layer has a bottom part and a sidewall part, and the bottom part is a single layer and physically contacts the first plug while the sidewall part is a dual layer. The second plug fills the opening and on the barrier layer. Moreover, a process of forming a plug structure is also provided.

7 Claims, 6 Drawing Sheets

(56) References Cited

U.S. PATENT DOCUMENTS

| | | |
|---|---|---|
| 2010/0038792 A1* | 2/2010 | Ochimizu et al. ............ 257/758 |
| 2011/0014773 A1 | 1/2011 | Lin |
| 2011/0031630 A1* | 2/2011 | Hashimoto ................... 257/774 |
| 2011/0057317 A1* | 3/2011 | Koike et al. .................... 257/751 |
| 2011/0230041 A1* | 9/2011 | Chakihara et al. ............ 438/587 |
| 2012/0074475 A1* | 3/2012 | Chew et al. .................... 257/295 |
| 2013/0249045 A1* | 9/2013 | Kang et al. .................... 257/499 |
| 2013/0270702 A1* | 10/2013 | Yu et al. ........................ 257/751 |

\* cited by examiner

PLUG STRUCTURE

BACKGROUND OF THE INVENTION

1. Field of the Invention

The present invention relates generally to a plug structure and a process thereof, and more specifically to a plug structure and a process thereof that removes parts of barrier layers by performing an argon sputtering process.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality. In the conventional method of fabricating transistors, a gate structure is first formed on a substrate, and a lightly doped drain (LDD) is formed on the two corresponding sides of the gate structure. Then, a spacer is formed on the sidewall of the gate structure and an ion implantation process is performed to form a source/drain within the substrate by utilizing the gate structure and spacer as a mask. In order to incorporate the gate, source, and drain into the circuit, contact plugs are often utilized for interconnection purposes. Each of the contact plugs include a surrounding barrier layer having a U-shaped cross-sectional profile, that is also formed below a low resistivity material to prevent the low resistivity material from diffusing outward to other areas. As the miniaturization of semiconductor devices increases, filling the barrier layer and the low resistivity material into a contact hole has become an important issue to form the contact plug and maintaining or enhancing the performances of formed semiconductor devices as well.

SUMMARY OF THE INVENTION

The present invention provides a plug structure and a process thereof, which performs a sputtering process to remove at least part of a bottom part of a barrier layer, to improve the performance of a formed semiconductor component.

The present invention provides a plug structure including a first dielectric layer, a second dielectric layer, a barrier layer and a second plug. The first dielectric layer having a first plug therein is located on a substrate, wherein the first plug physically connects a source/drain in the substrate. The second dielectric layer having an opening exposing the first plug is located on the first dielectric layer. The barrier layer conformally covers the opening, wherein the barrier layer has a bottom part and a sidewall part, and the bottom part is a single layer and physically connects the first plug while the sidewall part is a dual layer. The second plug fills the opening and on the barrier layer.

The present invention provides a method of forming a plug structure including the following steps. A substrate having a source/drain therein is provided. A first dielectric layer and a second dielectric layer are sequentially formed on the substrate, wherein the first dielectric layer has a first plug therein physically connecting the source/drain, and the second dielectric layer has an opening exposing the first plug. A barrier layer is formed to conformally cover the opening and the first plug. A first sputtering process is performed to remove at least part of a bottom part of the barrier layer while keeping a sidewall part of the barrier layer. A second plug is formed in the opening.

According to the above, the present invention provides a plug structure and a process thereof, which performs a first sputtering process to remove a bottom part of at least one layer of a barrier layer, so the contact resistance (Rc) between each of a first contact plug and a second contact plug can be reduced. The adhesion between the first contact plug and the second contact plug can be enhanced, and the top critical dimension (CD) of the barrier layer and the opening filling can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
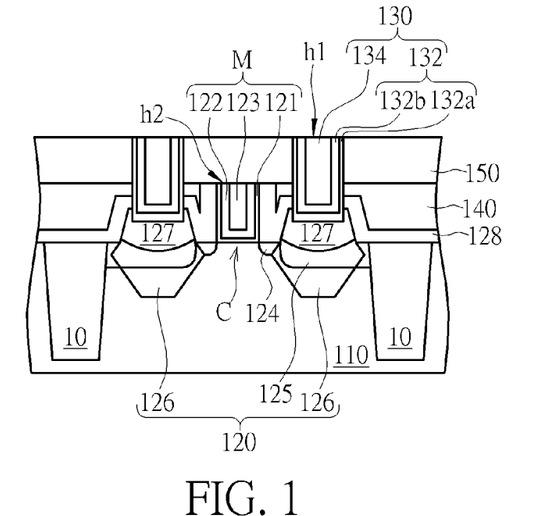
FIGS. 1-6 schematically depict cross-sectional views of a method of forming a plug structure according to a first embodiment of the present invention.

FIGS. 1-6 schematically depict cross-sectional views of a method of forming a plug structure according to a first embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Isolation structures 10 are formed in the substrate 110 to electrically isolate each MOS transistor. A MOS transistor 120 is formed on/in the substrate 110. The MOS transistor 120 may include a metal gate M on the substrate, and the metal gate M may includes a stacked structure including a dielectric layer 121, a work function layer 122 and a low resistivity material 123 sequentially from bottom to top; a lightly doped source/drain 124, a source/drain 125 and an epitaxial structure 126 are formed in the substrate 110 beside the metal gate M. The dielectric layer 121 may include a selective barrier layer (not shown) and a dielectric layer having a high dielectric constant, wherein the selective barrier layer may be an oxide layer formed through a thermal oxide process or a chemical oxide process etc, and the dielectric layer having a high dielectric constant may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and bariumstrontiumtitanate ($Ba_xSr_{1-x}TiO_3$, BST). The work function layer 122 may be a single layer or a multilayer, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN) or etc. The low resistivity material 123 may be composed of aluminum, tungsten, titanium aluminum (TiAl) alloy, cobalt tungsten phosphide (CoWP) or etc, but it is not limited thereto.

Barrier layers (not shown) may be selectively formed between the dielectric layer 121, the work function layer 122 or the low resistivity material 123, wherein the barrier layers may be single layers or multilayers composed of tantalum nitride (TaN) or titanium nitride (TiN) etc. The lightly doped source/drain 124 and the source/drain 125 may be doped by trivalent ions or pentavalent ions such as boron or phosphorus etc, depending upon the electrical type of the MOS transistor M. The epitaxial structure 126 may be a silicon germanium epitaxial structure or a silicon carbide epitaxial structure etc.

A contact etch stop layer 128 and a first dielectric layer 140 are located on the substrate 110 but exposing the metal gate M. The contact etch stop layer 128 and the first dielectric layer 140 may be formed by deposition and planarization after the source/drain 125 is formed and before the metal gate M is formed. The contact etch stop layer 128 may be a nitride layer or a doped nitride layer having a capability of inducing stresses to a gate channel C below the metal gate M; the first dielectric layer 140 may be an oxide layer, but it is not limited thereto. Then, a cap layer 150 is formed on the first dielectric layer 140. The cap layer 150 may be a nitride layer or a carbon-doped silicon nitride layer, but it is not limited thereto.

Thereafter, first plugs 130 are formed in the cap layer 150 and the first dielectric layer 140, and are physically connected to the source/drain 126. A metal silicide 127 may be formed between the first plugs 130 and the source/drain 126 for buffering the source/drain 126 and the first plugs 130. The first plug 130 may include a barrier layer 132 and a low resistivity material 134. The barrier layer 132 is a U-shaped dual layer including a Ti layer 132$a$ and a TiN layer 132$b$ from bottom to top, but it is not limited thereto; in another embodiment, the barrier layer 132 may be a single layer or another multilayer. The low resistivity material 134 may be composed of copper or tungsten etc. Two first plugs 130 are described in this embodiment, but the number of first plugs 130 is not restricted thereto, depending upon the practical needs.

In this embodiment, the cap layer 150 is formed on the first dielectric layer 140 and covers the metal gate M to prevent it from being damaged by later performed processes, and the first plugs 130 extend to the cap layer 150 to be electrically connected to external circuits. Therefore, a top surface h1 of the first plugs 130 is higher than a top surface h2 of the metal gate M. Additionally, in another embodiment, the cap layer 150 may not be formed and the first plugs 130 may be on the same level as the metal gate M. In another embodiment, a first cap layer and a second cap layer are formed on the first dielectric layer 140 from bottom to top; first plugs 130 are formed in these two cap layers and the first dielectric layer 140, wherein the first plugs 130 physically connect the source/drain 125; thereafter, a metal silicide may be formed in the first plugs 130, a dual layer having a U-shaped cross-sectional profile including a titanium layer and a titanium nitride layer is formed, a low resistivity material such as copper or tungsten is filled, and then a planarization step using a polishing solution having high etching selectivity to the first cap layer and the second cap layer is performed, so as to stop the polishing on the first cap layer, thereby improving the dishing effect of the chemical mechanical polishing (CMP).

Figure 2:
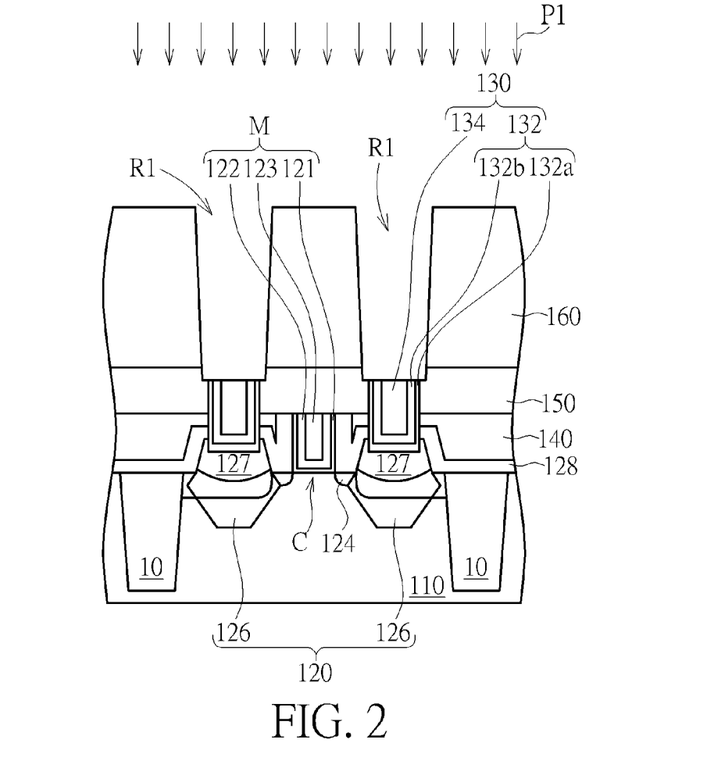

As shown in FIG. 2, a second dielectric layer (not shown) entirely covers the cap layer 150 and then is patterned to form a second dielectric layer 160 on the cap layer 150 while having openings R1 exposing the first plugs 130. Two openings R1 are formed in this embodiment to correspond to the two first plugs 130, but the number of the openings R1 is not restricted thereto, but corresponds to the number of first plugs 130. It is emphasized that, the first plugs 130 have metal oxide layers thereon. In this embodiment, the metal oxide layers are native oxide layers formed when the first plugs 130 are exposed to the air during the transfer between different chambers, but it is not limited thereto. Thus, a second sputtering process P1 may be selectively performed to remove the metal oxide layers. In this embodiment, the second sputtering process P1 is an argon (Ar) sputtering process, but it is not limited thereto.

Figure 3:
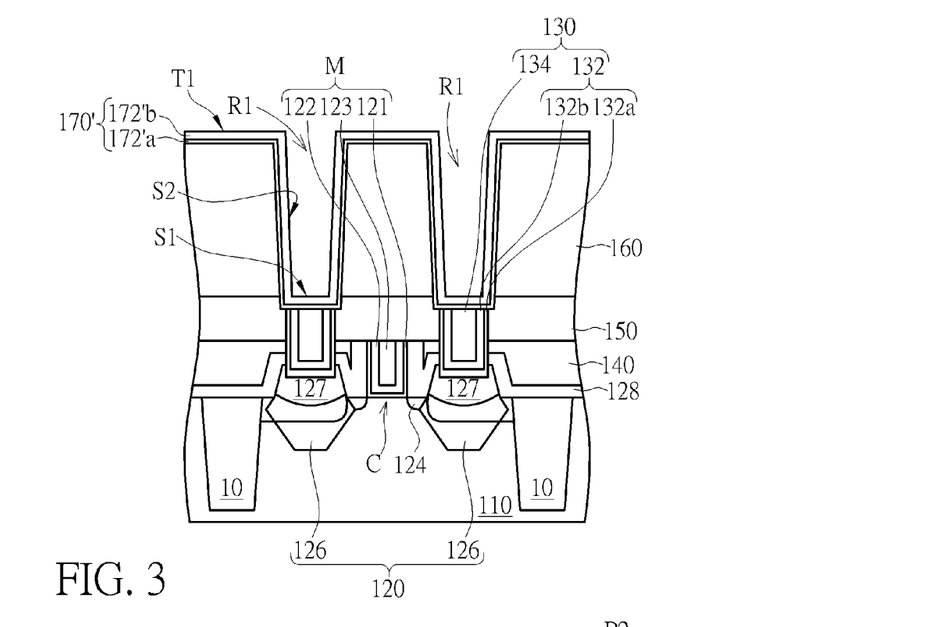

As shown in FIG. 3, a barrier layer 170' is formed to conformally cover the openings R1, the first plugs 130 and the second dielectric layer 160, wherein the barrier layer 170' includes a Ti layer 172'$a$ and a TiN layer 172'$b$ from bottom to top in this embodiment, but the barrier layer 170' may be a single layer or another multilayer in another embodiment.

Figure 4:
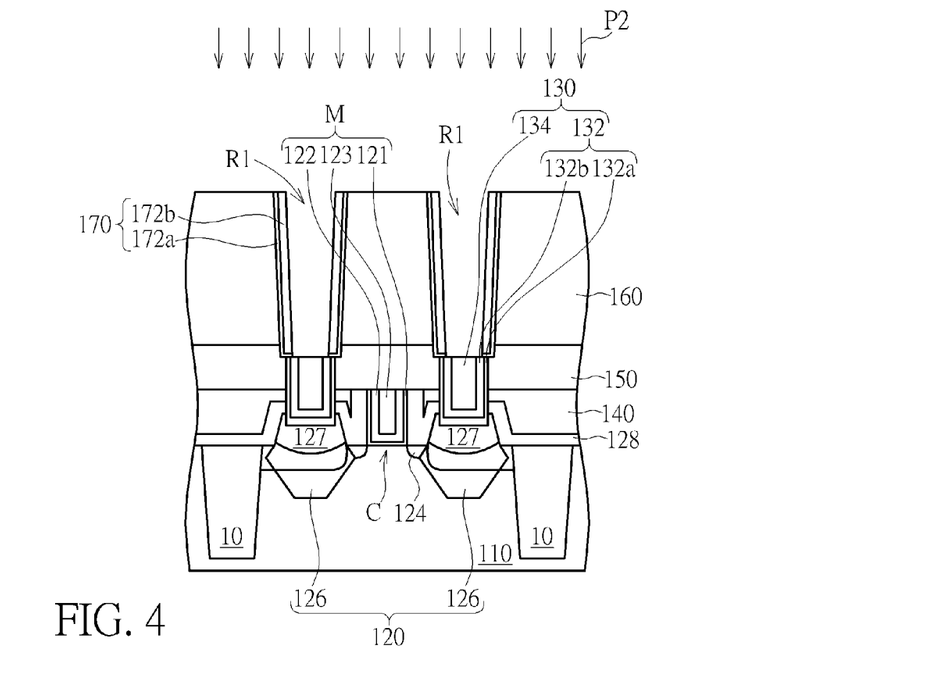

A first sputtering process P2 is performed to remove a bottom part S1 and a top part T1 of the barrier layer 170' but still keeping a sidewall part S2 of the barrier layer 170', so as to form barrier layers 170 having a Ti layer 172$a$ and a TiN layer 172$b$ on the sidewall of the openings R1, as shown in FIG. 4. In a preferred case, the first sputtering process P2 is an argon (Ar) sputtering process to remove parts of the barrier layer 170' without reacting with the barrier layer 170', but it is not limited thereto. Furthermore, the first sputtering process P2 can remove oxide layers. The oxide layers are formed after the first plugs 130 are formed, and some of the oxide layers may still remain even after the second sputtering process P1 is performed, so the first sputtering process P2 can further remove the residues of the oxide layers. In one case, the first sputtering process P2 and the second sputtering process P1 are the same, so that the processes can be simplified by performing them in the same way. Preferably, the formation of the barrier layer 170' and the first sputtering process P2 are performed in different chambers. Even more, the formation of the Ti layer 172'$a$, of the TiN layer 172'$b$ and the first sputtering process P2 are all performed in different chambers. More precisely, the Ti layer 172'$a$ may be formed through a physical vapor deposition (PVD) process while the TiN layer 172'$b$ is formed through a chemical vapor deposition (CVD) process, but it is not limited thereto.

Figure 5:
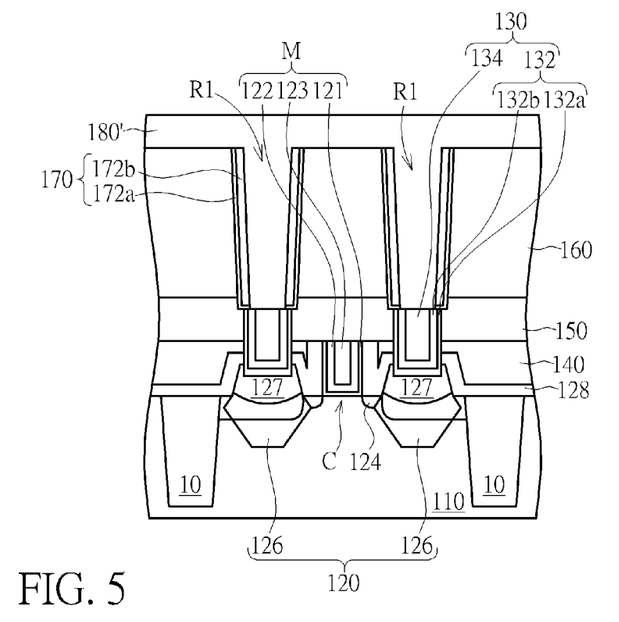
Figure 6:
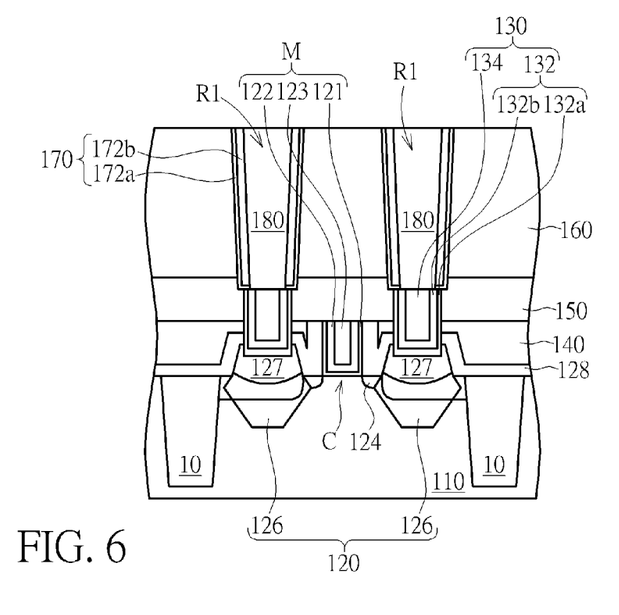

As shown in FIG. 5, a low resistivity material 180' is filled into the openings R1 and covers the second dielectric layer 160. Then, the low resistivity material 180' is planarized, so second plugs 180 are formed in the openings R1 as shown in FIG. 6. The low resistivity material 180' may be composed of copper or tungsten, and so do the second plugs 180. The second plugs 180 physically contact the first plugs 130. More specifically, the second plugs 180 having low resistivity materials are physically connected the low resistivity materials 134 of the two first plugs 130. Thus, the number of the second plugs 180 corresponds to the number of the first plugs 130.

Accordingly, due to the bottom part S1 of the barrier layer 170' being removed by the first sputtering process P2, the second plugs 180 can directly contact the first plugs 130 physically. Therefore, the contact resistance Rc between the second plugs 180 and the first plugs 130 can be reduced. Moreover, the adhesivity of the second plugs 180 to the first plugs 130 is better than the adhesivity of the Ti layers 172$a$ to the first plugs 130 and the adhesivity of the TiN layers 172$b$ to the second plugs 180. The top critical dimension (CD) of the barrier layer 170 can be improved, the openings R1 filling can be improved, and the seam in the second plugs 180 is reduced.

In this embodiment, the bottom part S1 of the barrier layer 170' including the Ti layer 172'$a$ and the TiN layer 172'$b$ are all removed. However, in a second embodiment described in the following, only the bottom part of the Ti layer 172'$a$ is removed while the bottom part of the TiN layer 172'*b* is kept, but the second embodiment still have the aforesaid advantages.

FIGS. 7-10 schematically depict cross-sectional views of a method of forming a plug structure according to a second embodiment of the present invention. The first steps of the second embodiment are the same as the steps of FIGS. 1-2. The steps may include: a first dielectric layer 140 having first plugs 130 therein is formed on a substrate 110, wherein the first plugs 130 are physically connected to a source/drain 125 of a MOS transistor M in the substrate 110. A second dielectric layer 160 having openings R1 exposing the first plugs 130 is formed on the first dielectric layer 140. It is emphasized that the first plugs 130 have metal oxide layers thereon. In this embodiment, the metal oxide layers are native oxide layers formed when the first plugs 130 are exposed to the air during the transfer between different chambers, but it is not limited thereto. Thus, a second sputtering process P1 may be selectively performed to remove the metal oxide layers. In this embodiment, the second sputtering process P1 is an argon (Ar) sputtering process, but it is not limited thereto.

Figure 7:
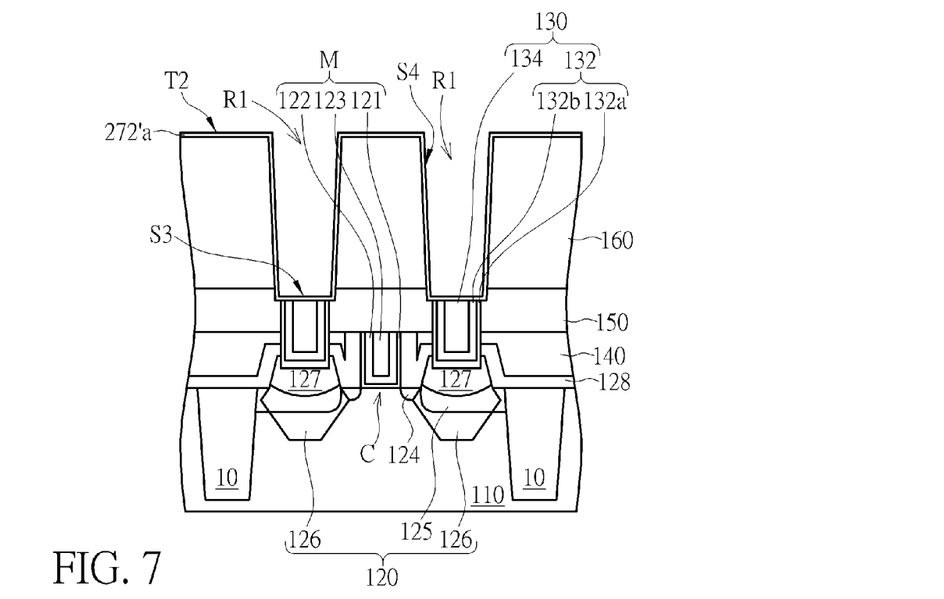
FIGS. 7-10 schematically depict cross-sectional views of a method of forming a plug structure according to a second embodiment of the present invention.
Figure 8:
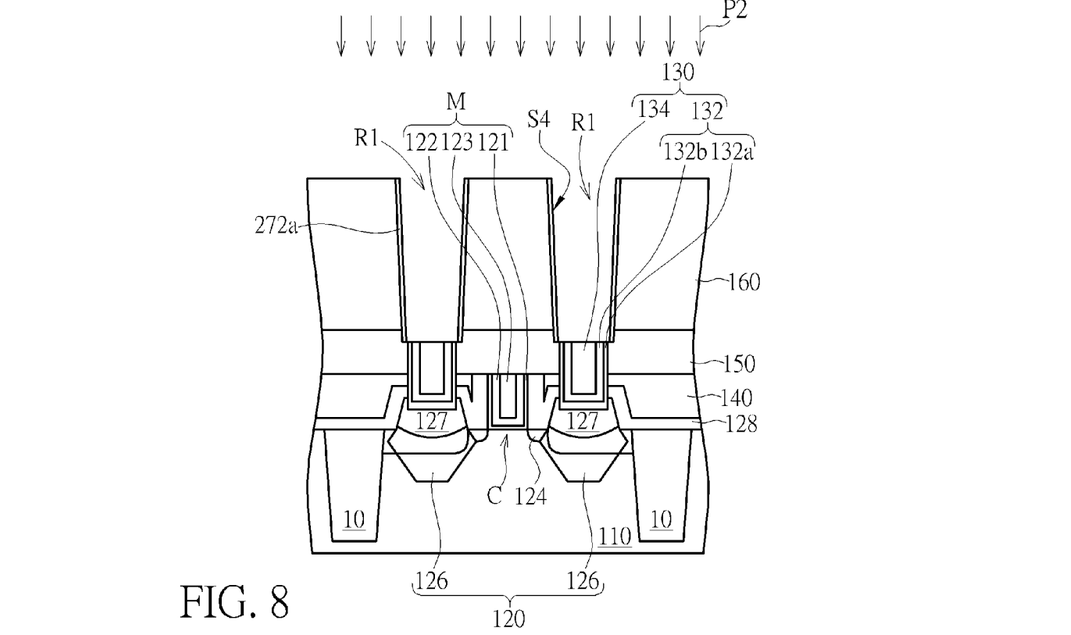

Then, as shown in FIG. 7, a Ti layer 272'*a* is formed to conformally cover the openings R1, the second dielectric layer 160 and the first plugs 130. Thereafter, a first sputtering process P2 is performed to remove a bottom part S3 and a top part T2 of the Ti layer 272'*a* while keeping a sidewall part S4 of the Ti layer 272'*a*, and a Ti layer 272*a* is therefore formed, as shown in FIG. 8. The first sputtering process P2 is an argon (Ar) sputtering process for removing parts of the Ti layer 272'*a* without reacting with the Ti layer 272'*a*, but it is not limited thereto. The first sputtering process P2 can further remove oxide layers. The oxide layers are formed after the first plugs 130 are formed and some of the oxide layers may still remain even after the second sputtering process P1 is performed, so the first sputtering process P2 can further remove the residues of the oxide layers. In one case, the first sputtering process P2 and the second sputtering process P1 are the same, so that the processes can be simplified by performing them in the same way. Preferably, the formation of the Ti layer 272'*a* and the first sputtering process P2 are performed in different chambers.

Figure 9:
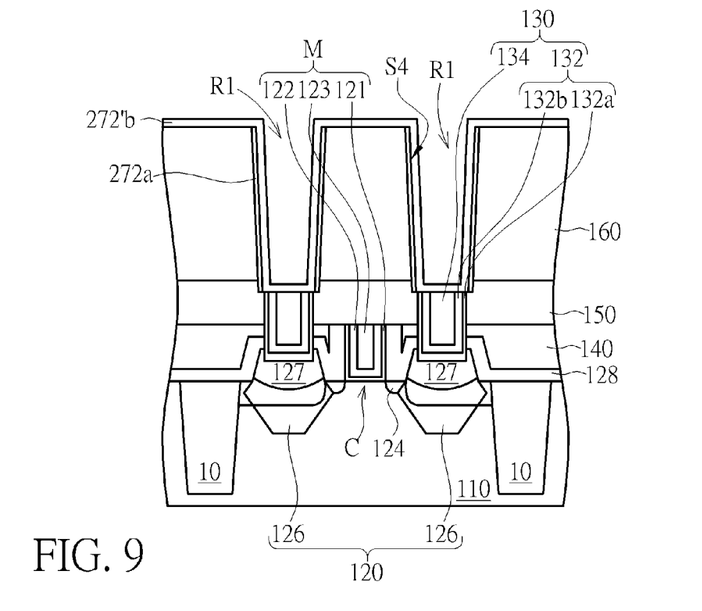
Figure 10:
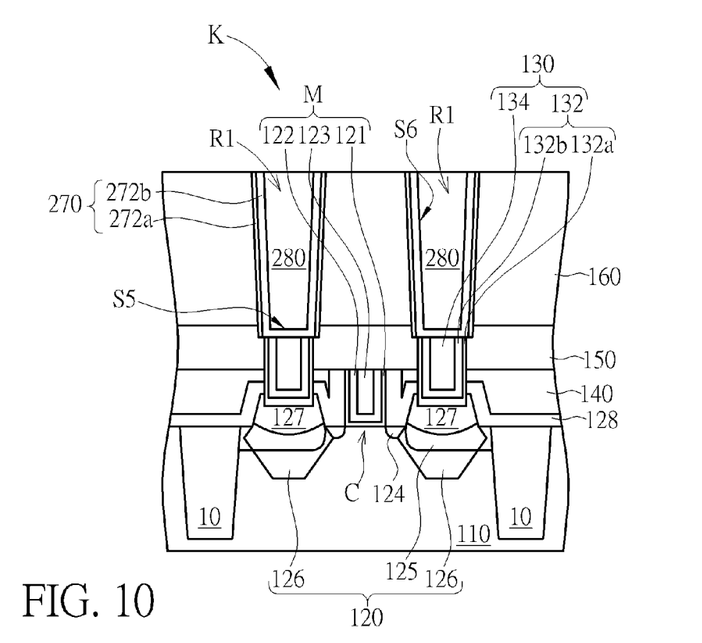

As shown in FIG. 9, a TiN layer 272'*b* is formed on the Ti layer 272*a*, the first plugs 130 and the second dielectric layer 160. Then, a low resistivity material (not shown) is filled into the openings R1 and covers the second dielectric layer 160. The low resistivity material (not shown) and the TiN layer 272'*b* are planarized, so TiN layers 272*b* and second plugs 280 are formed in the openings R2 as shown in FIG. 10, wherein the TiN layers 272*b* and the Ti layers 272*a* constitute barrier layers 270. The low resistivity material (not shown) may be composed of copper or tungsten etc, and so do the second plugs 280. The second plugs 280 are connected to the two first plugs 130 through bottom parts S5 of the TiN layer 272*b*. In this embodiment, each of the barrier layers 270 has a bottom part S5 and a sidewall part S6, and the bottom parts S5 are single layers which are physically connected to each of the first plugs 130 while the sidewall parts S6 are dual layers.

In another embodiment, the barrier layer 270 may be another multilayer with a bottom part of at least one of layers being removed by the first sputtering process P2.

Accordingly, since the bottom part of the Ti layer 272'*a* is removed by the first sputtering process P2, the contact resistance Rc between the second plugs 280 and the first plugs 130 can be reduced. Moreover, the adhesivity of the TiN layer 272*b* to the first plugs 130 is better than the adhesivity of the Ti layer 272*a* to the first plugs 130. The top critical dimension (CD) of the barrier layers 270 can be improved, the filling of the openings R1 can be improved, and the seam in the second plugs 280 is reduced.

Above all, the first embodiment and the second embodiment all use structures having the second contact plugs 180/280 being physically connected to the first contact plugs 130 only. However, the present invention can also use other structures having the second contact plugs being physically connected to the first contact plugs and the metal gate, or the second contact plugs being physically connected to the metal gate only.

Figure 11:
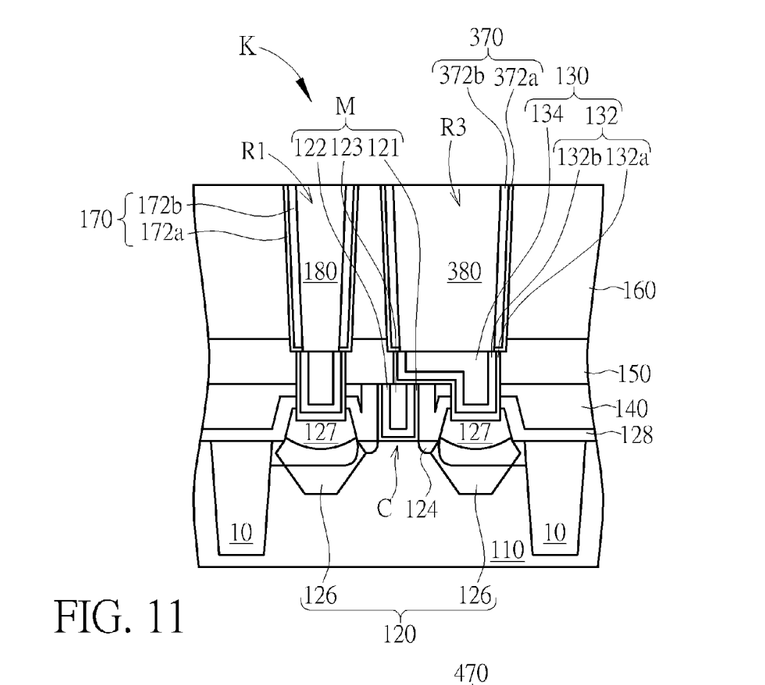
FIG. 11 schematically depicts a cross-sectional view of a plug structure according to an embodiment of the present invention.

FIG. 11 schematically depicts a cross-sectional view of a plug structure according to an embodiment of the present invention. As shown in FIG. 11, the second contact plugs 180 are physically connected to the first contact plugs 130, and the barrier layer 170 including the Ti layer 172*a* and the TiN layer 172*b* cover the sidewalls of the opening R1 just like in the first embodiment. The difference is that a second contact plug 380 physically contacts a first contact plug 130 and the metal gate M, and a barrier layer 370 including a Ti layer 372*a* and a TiN layer 372*b* covering the sidewalls of a opening R3. This structure can also be formed by the method of the first embodiment, although the size of the opening R3 is larger than the size of the opening R1. Furthermore, the structure shown in FIG. 11 is formed by using the method of the first embodiment, but the structure having the second contact plug 380 physically contacting a first contact plug 130 and the metal gate M can also be formed by the method of the second embodiment.

Figure 12:
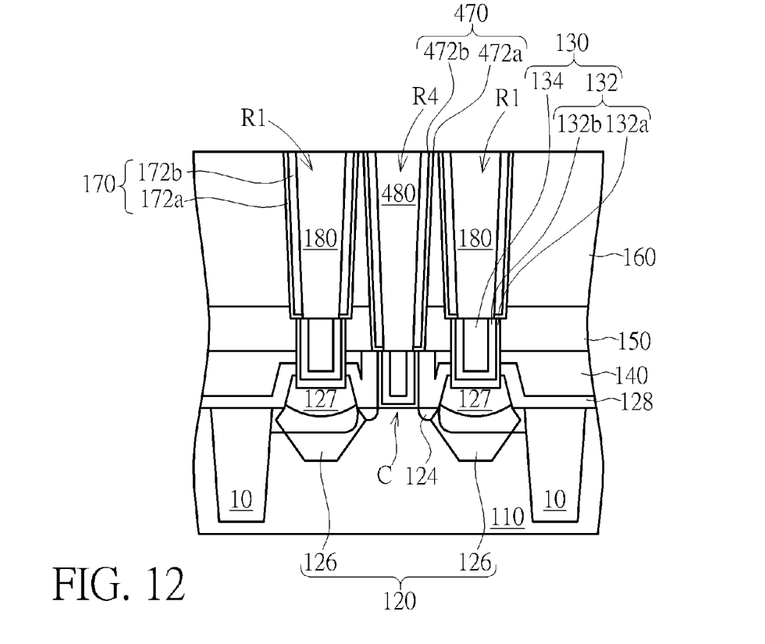
FIG. 12 schematically depicts a cross-sectional view of a plug structure according to an embodiment of the present invention.

FIG. 12 schematically depicts a cross-sectional view of a plug structure according to an embodiment of the present invention. As shown in FIG. 12, the second contact plugs 180 are physically connected to the first contact plugs 130, and each of the barrier layer 170 including the Ti layer 172*a* and the TiN layer 172*b* cover the sidewalls of the opening R1, just like in the first embodiment. The difference is that a second contact plug 480 physically contact the metal gate M, and a barrier layer 470 including a Ti layer 472*a* and a TiN layer 472*b* covering the sidewalls of a opening R4. This structure can also be formed by the method of the first embodiment, although the size of the opening R4 is smaller than the size of the opening R1. Furthermore, the structure shown in FIG. 12 is formed by using the method of the first embodiment, but the structure having the second contact plug 480 physically contacting the metal gate M only can also be formed by the method of the second embodiment.

To summarize, the present invention provides a plug structure and a process thereof, which performs a first sputtering process to remove a bottom part of at least one layer of a barrier layer, so the contact resistance between each of a first contact plug and a second contact plug can be reduced, the adhesivity between the first contact plug and the second contact plug can be enhanced and the top critical dimension (CD) of the barrier layer and the openings filling can be improved.

Moreover, as the bottom parts of all layers of the barrier layer are removed, oxide layers such as native oxide layers formed on the first contact plugs can be further removed by the first sputtering process. Or, the oxide layers may be removed previously by a second sputtering process performed before the barrier layer is formed. Preferably, the first sputtering process and the second sputtering process may be argon (Ar) sputtering processes to remove the barrier layer without reacting with it. Furthermore, the formation of the barrier layer and the first sputtering process are performed in different chambers. Even more, the formation of the layers of the barrier layer and the first sputtering process are all performed in different chambers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A plug structure, comprising:
   a first dielectric layer having a first plug therein located on a substrate, wherein the first plug contacts a source/drain in the substrate;
   a second dielectric layer having an opening exposing the first plug located on the first dielectric layer;
   a barrier layer conformally covering the opening, wherein the barrier layer has a bottom part and a sidewall part, and the bottom part is a single layer and physically contacts the first plug while the sidewall part is a dual layer;
   a second plug filling the opening on the barrier layer;
   a cap layer located between the first dielectric layer and the second dielectric layer, the first plug extending to the cap layer; and
   a metal gate disposed in the first dielectric layer, wherein the top of the metal gate trims with the top of the first dielectric layer.

2. The plug structure according to claim 1, further comprising:
   the metal gate contacting a second plug in the second dielectric layer.

3. The plug structure according to claim 1, wherein the first plug extends to the cap layer so as to be higher than the metal gate.

4. The plug structure according to claim 1, wherein the bottom part comprises a TiN layer.

5. The plug structure according to claim 1, wherein the sidewall part comprises a Ti layer and a TiN layer.

6. The plug structure according to claim 1, wherein the first plug and the second plug comprise tungsten or copper.

7. A plug structure, comprising:
   a first dielectric layer having a first plug therein located on a substrate, wherein the first plug contacts a source/drain in the substrate;
   a second dielectric layer having an opening exposing the first plug located on the first dielectric layer;
   a barrier layer being a dual layer conformally covering the sidewall of the opening;
   a second plug filling the opening and physically contacting the first plug; and
   a metal gate disposed in the first dielectric layer, wherein the top of the metal gate trims with the top of the first dielectric layer.

* * * * *